United States Patent
Kawasaki et al.

(10) Patent No.: US 10,186,487 B2
(45) Date of Patent: Jan. 22, 2019

(54) SEMICONDUCTOR DEVICE

(71) Applicant: Toshiba Memory Corporation, Tokyo (JP)

(72) Inventors: Kazushige Kawasaki, Yokohama Kanagawa (JP); Mikihiko Ito, Ota Tokyo (JP); Masaru Koyanagi, Ota Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/688,848

(22) Filed: Aug. 28, 2017

(65) Prior Publication Data

US 2018/0277484 A1 Sep. 27, 2018

(30) Foreign Application Priority Data

Mar. 22, 2017 (JP) ................. 2017-055239

(51) Int. Cl.
*H01L 23/538* (2006.01)
*H01L 25/065* (2006.01)
*H01L 23/498* (2006.01)

(52) U.S. Cl.
CPC .... *H01L 23/5384* (2013.01); *H01L 23/49811* (2013.01); *H01L 25/0657* (2013.01); *H01L 2225/06513* (2013.01)

(58) Field of Classification Search
CPC ........... H01L 23/5384; H01L 23/49811; H01L 25/0657; H01L 2225/06513
See application file for complete search history.

(56) References Cited

U.S. PATENT DOCUMENTS

| 7,446,420 B1 | 11/2008 | Kim |
| 8,659,141 B2 | 2/2014 | Crisp et al. |
| 8,941,246 B2 | 1/2015 | Miura et al. |
| 2012/0018885 A1* | 1/2012 | Lee ........... H01L 23/481 257/738 |
| 2013/0075895 A1* | 3/2013 | Miura .......... H01L 27/115 257/737 |

(Continued)

FOREIGN PATENT DOCUMENTS

| JP | 2013080912 A | 5/2013 |
| JP | 2014529202 A | 10/2014 |

(Continued)

OTHER PUBLICATIONS

Taiwan Office Action dated Apr. 9, 2018, filed in Taiwan counterpart Application No. 106126197, 6 pages (with translation).

*Primary Examiner* — Yosef Gebreyesus
(74) *Attorney, Agent, or Firm* — Patterson & Sheridan, LLP (57) ABSTRACT

A semiconductor device includes a first chip having a through via, a second chip having a first terminal that is electrically connected to the through via, and a substrate having a second terminal disposed on a first surface thereof and electrically connected to the first terminal. When viewed along a straight line that intersects a center axis that is perpendicular to the first surface and intersects a center point of the substrate, the first terminal is disposed further towards the center axis than the second terminal and the through via is disposed further towards the center axis than the first terminal.

11 Claims, 7 Drawing Sheets

(56) References Cited

U.S. PATENT DOCUMENTS

2013/0271907 A1* 10/2013 Mortensen ............ H05K 1/113
361/679.02
2016/0079184 A1 3/2016 Tsukiyama et al.

FOREIGN PATENT DOCUMENTS

| JP | 2015176880 A | 10/2015 |
| JP | 2016052937 A | 4/2016 |
| JP | 2016063017 A | 4/2016 |

* cited by examiner

SEMICONDUCTOR DEVICE

CROSS-REFERENCE TO RELATED APPLICATION

This application is based upon and claims the benefit of priority from Japanese Patent Application No. 2017-055239, filed Mar. 22, 2017, the entire contents of which are incorporated herein by reference.

FIELD

Embodiments described herein relate generally to a semiconductor device.

BACKGROUND

In order to reduce the size of a semiconductor device, semiconductor chips are stacked in some configurations. A through via called a through silicon via (TSV) is used to establish an electrical connection among the stacked semiconductor chips. The through vias are typically connected to an external terminal via an interface chip.

DETAILED DESCRIPTION

An embodiment provides a semiconductor device with a wiring of shorter length between a through via and an external terminal.

In general, according to an embodiment, the semiconductor device includes a first chip having a through via, a second chip having a first terminal that is electrically connected to the through via, and a substrate having a second terminal disposed on a first surface thereof and electrically connected to the first terminal. When viewed along a straight line that intersects a center axis that is perpendicular to the first surface and intersects a center point of the substrate, the first terminal is disposed further towards the center axis than the second terminal and the through via is disposed further towards the center axis than the first terminal.

Hereinafter, a semiconductor device according to an embodiment will be described in detail with reference to the attached drawings. The present disclosure is not limited to the following embodiment.

First Embodiment

Figure 1A:
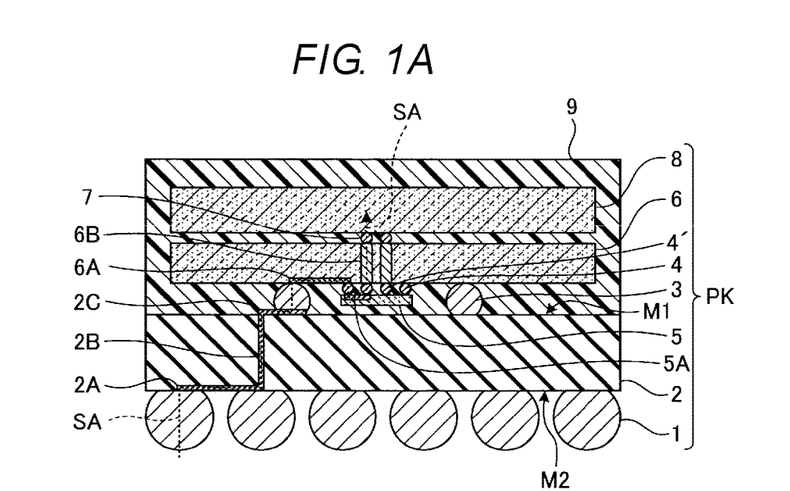
FIG. 1A is a cross-sectional view of a semiconductor device according to a first embodiment.
Figure 1B:
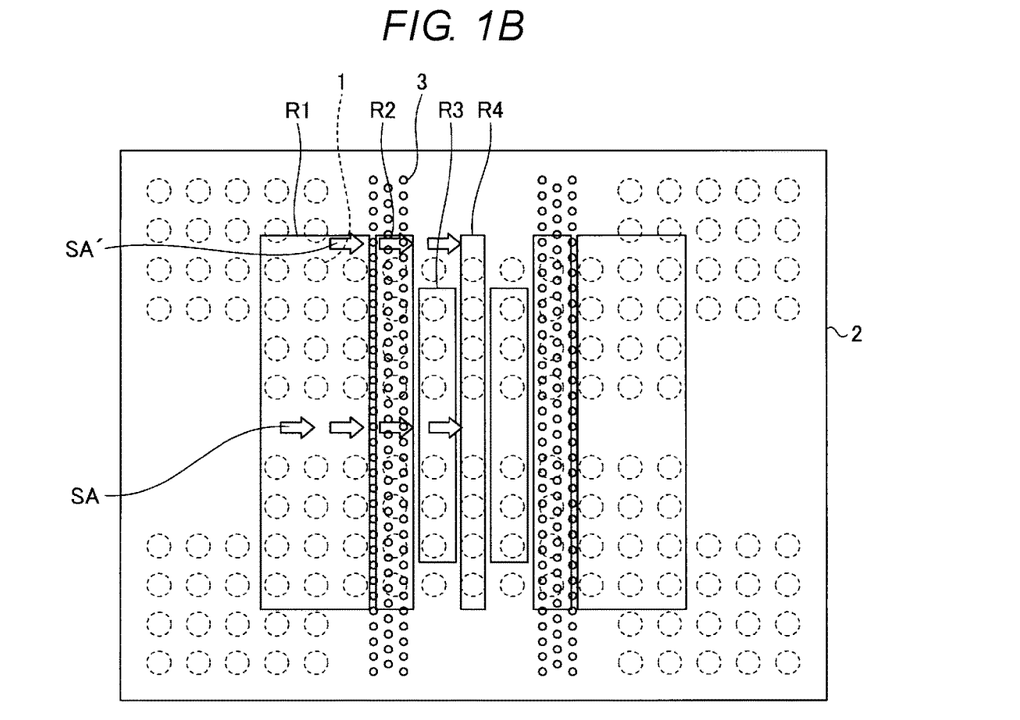
FIG. 1B is a plan view of electrodes of the semiconductor device according to the first embodiment.

FIG. 1A is a cross-sectional view of a semiconductor device according to a first embodiment. FIG. 1B is a plan view of electrodes of the semiconductor device according to the first embodiment.

In FIG. 1A, the semiconductor device includes semiconductor chips 5, 6, and 8 and an interposer substrate 2.

The semiconductor chip 5 is flip-chip mounted on the interposer substrate 2 via intermediate terminals 3. The semiconductor chip 8 is stacked on the semiconductor chip 6 via intermediate terminals 7. In addition, the semiconductor chip 5 is flip-chip mounted on the semiconductor 6 via intermediate terminals 4 and 4'. The mounting surface of the semiconductor chip 5 may be opposite to the mounting surface of the semiconductor chip 8.

The semiconductor chips 6 and 8 may have the same dimensions in each of the transverse direction, the longitudinal direction, and the height direction. A memory may be mounted on the semiconductor chips 6 and 8. The memory may be a nonvolatile memory such as a NAND flash memory or a resistive random access memory (ReRAM), or may be a volatile memory such as a dynamic random access memory (DRAM).

The dimensions of the semiconductor chip 5 in the transverse direction, the longitudinal direction, and the height direction may be made smaller than those of the semiconductor chips 6 and 8, respectively. A controller may be mounted on the semiconductor chip 5. The controller may operate, for example, as an interface when data are input to and output from the NAND memory. The controller may include, for example, a data input driver, a data output driver, a data input latch circuit, a data output multiplex circuit, and the like.

The semiconductor chip 6 includes wirings 6A and through vias 6B. The semiconductor chip 5 includes wirings 5A. The interposer substrate 2 includes a first surface M1 and a second surface M2. The second surface M2 is a surface opposite to the first surface M1. In FIG. 1A, the first surface M1 is a front surface of the interposer substrate 2, and the second surface M2 is a rear surface of the interposer substrate 2. The interposer substrate 2 includes wirings 2A to 2C. External terminals 1 are provided on the rear surface of the interposer substrate 2. The wirings 2A are provided on the rear surface of the interposer substrate 2. The wirings 2B are provided inside the interposer substrate 2. The wirings 2C are provided on the front surface of the interposer substrate 2. The wirings 2A and 2C are connected via the wirings 2B.

The external terminals 1 are connected to the intermediate terminals 3 via wirings 2A to 2C. The intermediate terminals 3 are connected to the intermediate terminals 4 via the wirings 6A. The intermediate terminals 4 are connected to the intermediate terminals 4' via the wirings 5A. Intermediate terminals 4' are connected to the through vias 6B

The external terminals 1 and the intermediate terminals 3, 4, 4', and 7 may be, for example, bump electrodes. The bump electrodes may be solder balls. The diameter of the external terminals 1 may be larger than the diameter of the intermediate terminals 3. The diameter of the intermediate terminals 3 may be larger than the diameters of the intermediate terminals 4 and 4'. The diameters of the intermediate terminals 4 and 4' may be equal to each other.

The semiconductor chips 5, 6, and 8 are sealed with a resin 9 on the interposer substrate 2, so that a package PK is formed. The package PK may be mounted on a motherboard via the external terminals 1.

Here, it is assumed that a signal path of an external signal SA from the outside is as follows: the external terminals 1→the intermediate terminals 3→the intermediate terminals 4→the through vias 6B. The outside may be a host capable of using the NAND memory as an external storage device or an external controller that performs a processing specific to the NAND memory.

At this time, with respect to the signal SA, it is possible to sequentially arrange the external terminals 1, the intermediate terminals 3, the intermediate terminals 4, and the through vias 6B from the exterior to the interior of the interposer substrate 2. That is, when viewed along a straight line that intersects a center axis that is perpendicular to the first surface M1 of the interposer substrate 2 and intersects a center point of the interposer substrate 2, the intermediate terminals 3 are disposed further inside (i.e., further towards the center axis along the straight line) the interposer substrate 2 than the external terminals 1, the intermediate terminals 4 are disposed further inside (i.e., further towards the center axis along the straight line) the substrate 2 than the intermediate terminals 3, and the through vias 6B are disposed further inside (i.e., further towards the center axis along the straight line) the interposer substrate 2 than the intermediate terminals 4. For example, as illustrated in FIG. 1B, the external terminals 1 may be disposed in a region R1 of the interposer substrate 2, the intermediate terminals 3 may be disposed in a region R2 of the interposer substrate 2, the intermediate terminals 4 may be disposed in a region R3 of the interposer substrate 2, and the through vias 6B may be disposed in a region R4 of the interposer substrate 2.

The signal SA may be transmitted at a higher transmission rate than that of a control signal. The signal SA is, for example, a clock CK and data DA. The data DA is, for example, read data or write data.

For example, a read enable signal REn may be used as a clock CK1 when reading data from the NAND memory. A data strobe signal DQS may be used as a clock CK2 when writing data to the NAND memory.

The control signal may be, for example, a chip enable signal CEn, an address latch enable signal ALE, a command latch enable signal CLE, a write enable signal WEn, or the like.

Power SA' and the like may be supplied to the semiconductor chips 6 and 8 from the outside through the path of the external terminals 1→the intermediate terminals 3→the through vias 6B without passing through the semiconductor chip 5.

Here, the signal path of the signal SA may be shortened by disposing the intermediate terminals 3 further inside the interposer substrate 2 than the external terminals 1, disposing the intermediate terminals 4 further inside the substrate 2 than the intermediate terminals 3, and disposing the through vias 6B further inside the interposer substrate 2 than the intermediate terminals 4, when viewed along a straight line that intersects a center axis that is perpendicular to the first surface M1 of the interposer substrate 2 and intersects a center point of the interposer substrate 2. Therefore, since the wiring length from the external terminals 1 to the through vias 6B is shortened, the wiring resistance and the wiring capacitance may be reduced. As a result, the delay amount of the signal SA may be reduced so that the timing gap between multiple signals SA is reduced.

Figure 2A:
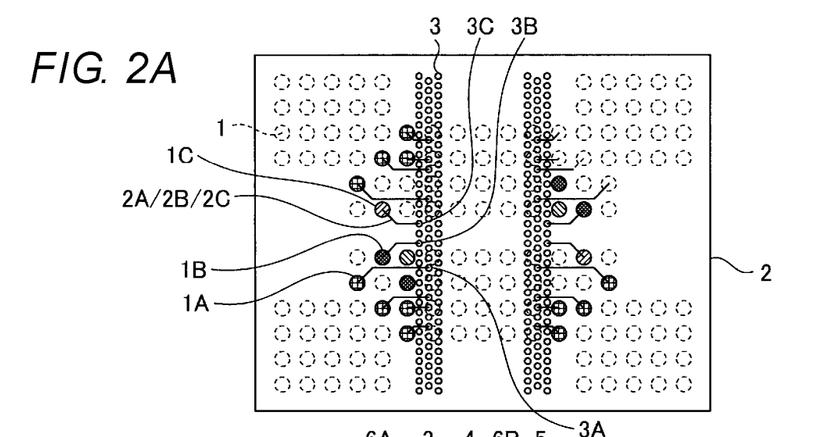
FIG. 2A is a plan view of a wiring path between an external terminal and an intermediate terminal of the semiconductor device according to the first embodiment.
Figure 2B:
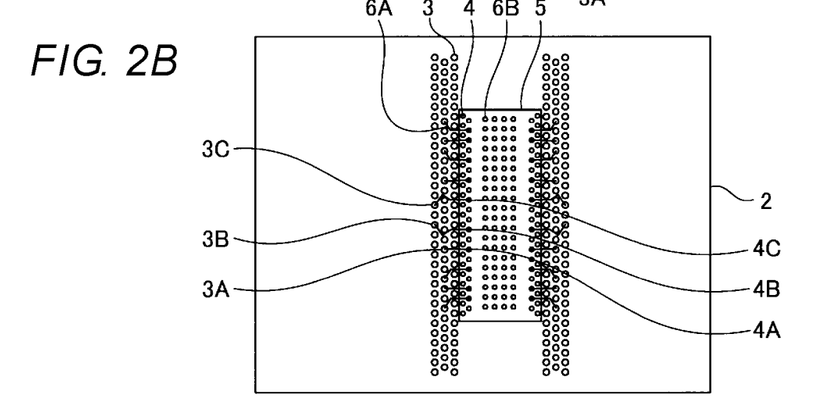
FIG. 2B is a plan view of a wiring path between intermediate terminals of the semiconductor device according to the first embodiment.
Figure 2C:
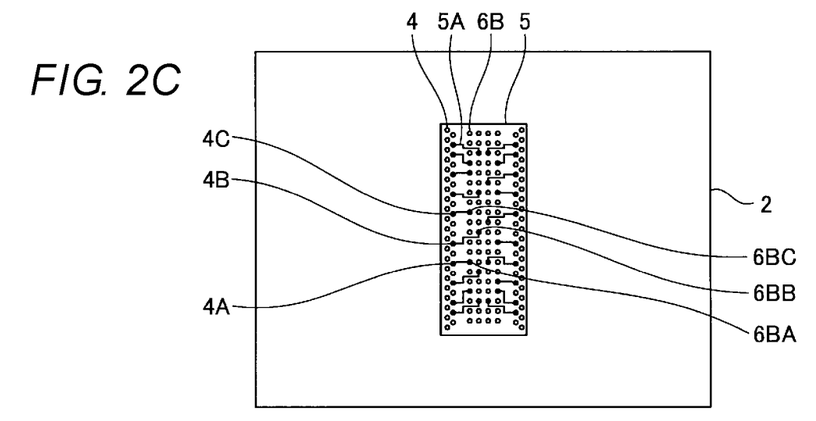
FIG. 2C is a plan view of a wiring path between intermediate terminals and through vias of the semiconductor device according to the first embodiment.

FIG. 2A is a plan view of a wiring path between external terminals and intermediate terminals of the semiconductor device according to the first embodiment. FIG. 2B is a plan view of a wiring path between intermediate terminals of the semiconductor device according to the first embodiment. FIG. 2C is a plan view of a wiring path between intermediate terminals and through vias of the semiconductor device according to the first embodiment.

In FIG. 2A, the external terminals 1 include external terminals 1A to 1C. For example, it is assumed that data DA is input to the external terminal 1A, clock CK1 is input to the external terminal 1B, and clock CK2 is input to the external terminal 1C. The intermediate terminals 3 include intermediate terminals 3A to 3C.

The external terminals 1A to 1C may be connected to the intermediate terminals 3A to 3C inside the external terminals 1A to 1C via the wirings 2A to 2C, respectively.

In FIG. 2B, the intermediate terminals 4 include intermediate terminals 4A to 4C. The intermediate terminals 3A to 3C may be connected to the intermediate terminals 4A to 4C inside the intermediate terminals 3A to 3C via the wirings 6A, respectively.

In FIG. 2C, the through vias 6B include through vias 6BA to 6BC. At this time, the intermediate terminals 4A to 4C may be connected to the through vias 6BA to 6BC inside the intermediate terminals 4A to 4C via the wirings 5A, respectively.

In FIG. 1B, the semiconductor chips 6 and 8 formed with a memory are stacked in two tiers. However, the semiconductor chips formed with a memory may be stacked in N tiers (N is an integer of 2 or more).

Second Embodiment

Figure 3A:
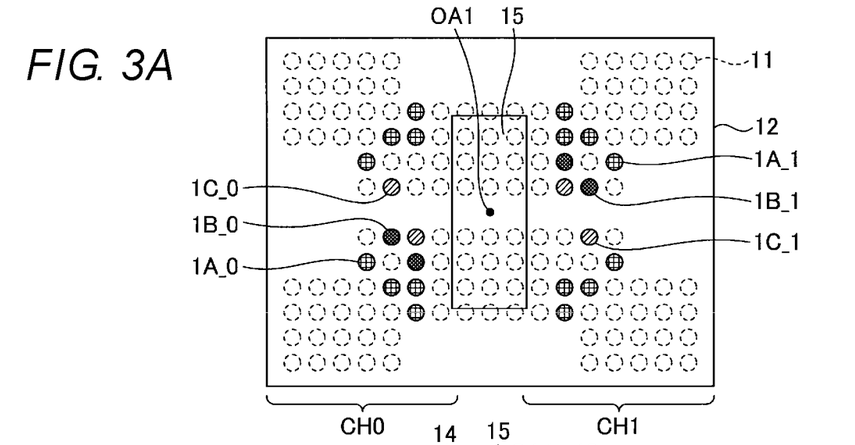
FIG. 3A is a plan view of external terminals on the rear surface side of an interposer substrate of a semiconductor device according to a second embodiment.
Figure 3B:
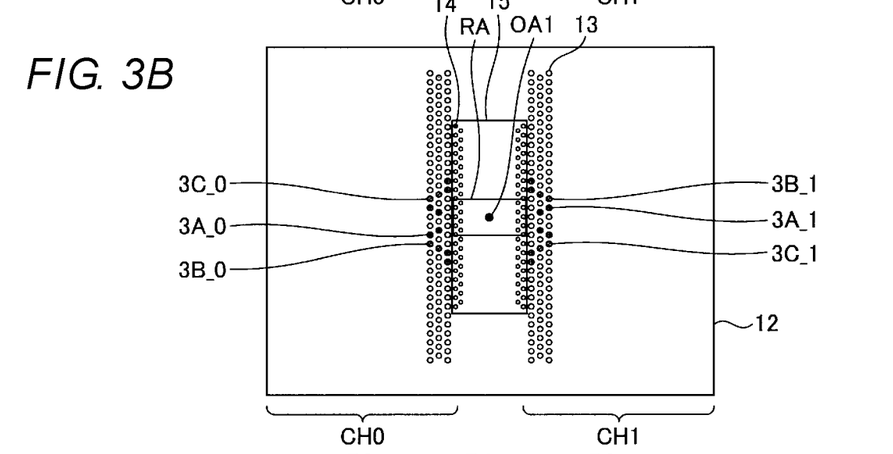
FIGS. 3B and 3C are plan views of intermediate terminals on the front surface side of the interposer substrate of the semiconductor device according to the second embodiment.
Figure 3C:
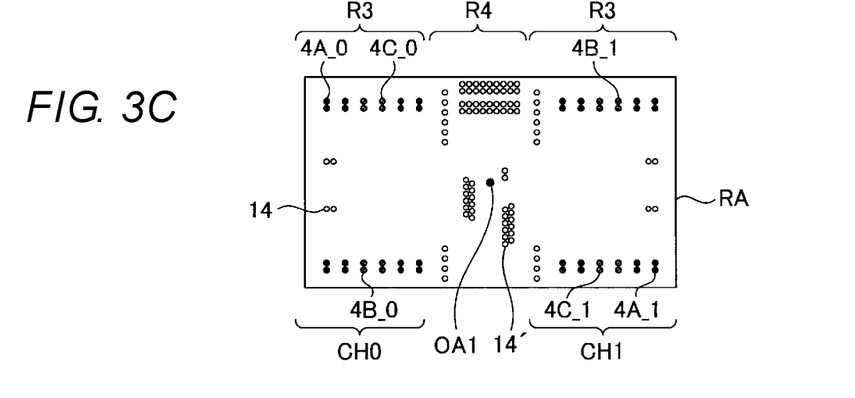

FIG. 3A is a plan view of external terminals on the rear surface side of an interposer substrate of a semiconductor device according to a second embodiment. FIGS. 3B and 3C are plan views of intermediate terminals on the front surface side of the interposer substrate of the semiconductor device according to the second embodiment. FIG. 3C illustrates a region RA of FIG. 3B in an enlarged scale.

In FIG. 3A, a semiconductor chip 15 is disposed on an interposer substrate 12. A controller may be mounted on the semiconductor chip 15. External terminals 11 are provided on the rear surface of the interposer substrate 12. The configuration of the interposer substrate 12 may be the same as the configuration of the interposer substrate 2 in FIG. 1A. This semiconductor device may include two channels CH0 and CH1.

The channels as described herein are a system which is communicable independently by itself. In this case, the controller may have a communication path for each channel. For example, a chip enable signal CEn, an address latch enable signal ALE, a command latch enable signal CLE, a write enable signal WEn, a read enable signal REn, a data strobe signal DQS, data DA, an address AD, and a command CM may be independently set for each channel.

The external terminals 11 may be arranged symmetrically on the interposer substrate 12 between the channels CH0 and CH1. In FIG. 3A, the external terminals 11 of the channel CH0 are disposed on the left half of the interposer substrate 12, and the external terminals 11 of the channel CH1 are disposed on the right half of the interposer substrate 12.

The external terminals 11 may include input/output terminals, control terminals, power supply terminals, or the like. At least one of the data DA, the address AD, the command CM, and the clocks CK1 and CK2 may be input to the input/output terminals. A control signal may be input to the control terminals. The control signal may be, for example, a chip enable signal CEn, an address latch enable signal ALE, a command latch enable signal CLE, or a write enable signal WEn.

Here, the input/output terminals assigned to the external terminals 11 may be arranged point-symmetrically about a reference point OA1 of the interposer substrate 12 between the channels CH0 and CH1. The reference point OA1 may be the center point of the interposer substrate 12. For example, the external terminals 11 include external terminals 1A_0 to 1C_0 and 1A_1 to 1C_1. In addition, data DA of each of the channels CH0 and CH1 is input to the external terminals 1A_0 and 1A_1, the clock CK1 of each of the channels CH0 and CH1 is input to the external terminals 1B_0 and 1B_1, and the clock CK2 of each of the channels CH0 and CH1 is input to the external terminals 1C_0 and 1C_1.

In this case, the external terminals 1A_0 of the channel CH0 and the external terminals 1A_1 of the channel CH1 may be arranged point-symmetrically. The external terminals 1B_0 of the channel CH0 and the external terminals 1B_1 of the channel CH1 may be arranged point-symmetrically. The external terminals 1C_0 of the channel CH0 and the external terminals 1C_1 of the channel CH1 may be arranged point-symmetrically.

In FIG. 3B, intermediate terminals 13 are provided on the interposer substrate 12. The intermediate terminals 13 may include input/output terminals, control terminals, power supply terminals, or the like. The intermediate terminals 13 may be connected to the external terminals 11.

Here, the intermediate terminals 13 may be arranged point-symmetrically about the reference point OA1 of the interposer substrate 12 between the channels CH0 and CH1. For example, the intermediate terminals 13 include intermediate terminals 3A_0 to 3C_0 and 3A_1 to 3C_1. In addition, data DA of each of the channels CH0 and CH1 is input to the intermediate terminals 3A_0 and 3A_1, the clock CK1 of each of the channels CH0 and CH1 is input to the intermediate terminals 3B_0 and 3B_1, and the clock CK2 of each of the channels CH0 and CH1 is input to the external terminals 3C_0 and 3C_1.

In this case, the intermediate terminals 3A_0 of the channel CH0 and the intermediate terminals 3A_1 of the channel CH1 may be arranged point-symmetrically about the reference point OA1. The intermediate terminals 3B_0 of the channel CH0 and the intermediate terminals 3B_1 of the channel CH1 may be arranged point-symmetrically about the reference point OA1. The intermediate terminals 3C_0 of the channel CH0 and the intermediate terminals 3C_1 of the channel CH1 may be arranged point-symmetrically about the reference point OA1.

In FIGS. 3B and 3C, intermediate terminals 14 and 14' are provided on the interposer substrate 12. The intermediate terminals 14 and 14' may include input/output terminals, control terminals, power supply terminals, or the like. The intermediate terminals 14 may be connected to the intermediate terminals 13 and 14'. The through vias 6B of FIG. 1A may be disposed on the intermediate terminals 14'. The intermediate terminals 14 may be disposed in the region R3 of FIG. 1B, and the intermediate terminals 14' may be disposed in the region R4 of FIG. 1B.

Here, the intermediate terminals 14 may be arranged point-symmetrically about the reference point OA1 of the interposer substrate 12 between the channels CH0 and CH1. For example, the intermediate terminals 14 include intermediate terminals 4A_0 to 4C_0 and 4A_1 to 4C_1. In addition, data DA of each of the channels CH0 and CH1 is input to the intermediate terminals 4A_0 and 4A_1, the clock CK1 of each of the channels CH0 and CH1 is input to the intermediate terminals 4B_0 and 4B_1, and the clock CK2 of each of the channels CH0 and CH1 is input to the external terminals 4C_0 and 4C_1.

At this time, the intermediate terminals 4A_0 of the channel CH0 and the intermediate terminals 4A_1 of the channel CH1 may be arranged point-symmetrically about the reference point OA1. The intermediate terminals 4B_0 of the channel CH0 and the intermediate terminals 4B_1 of the channel CH1 may be arranged point-symmetrically about the reference point OA1. The intermediate terminals 4C_0 of the channel CH0 and the intermediate terminals 4C_1 of the channel CH1 may be arranged point-symmetrically about the reference point OA1.

As described above, the respective input/output terminals assigned to the external terminals 11 or the intermediate terminals 13 and 14 may be arranged point-symmetrically about the reference point OA1 of the interposer substrate 12 between the channels CH0 and CH1. As a result, the transmission characteristics of signals input to the input/output terminals may be made equal to each other between the channels CH0 and CH1. Therefore, it is possible to suppress the timing gap of the signals input to the input/output terminals between the channels CH0 and CH1.

Third Embodiment

Figure 4:
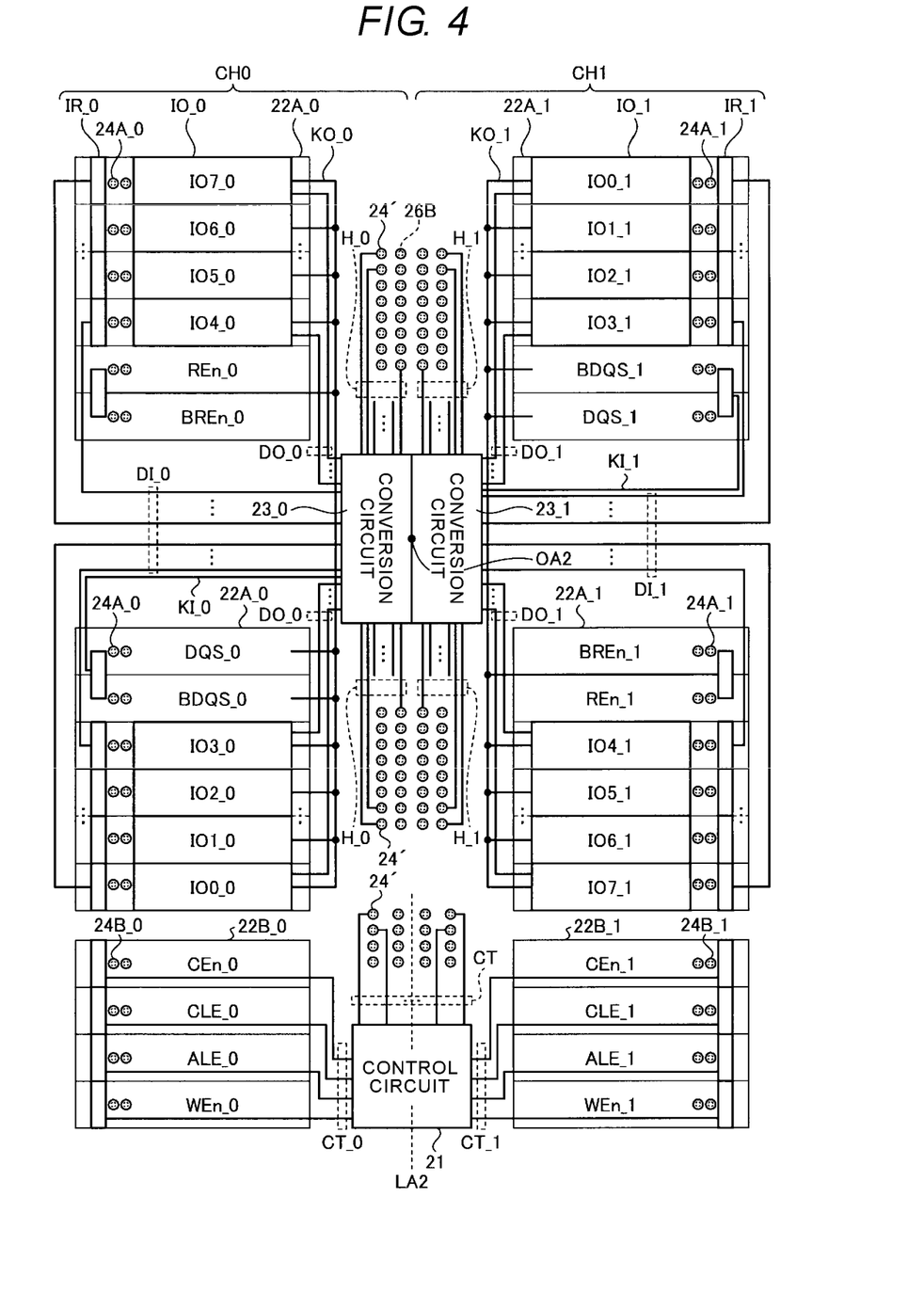
FIG. 4 is a plan view of intermediate terminals and circuit blocks disposed in a controller of a semiconductor device according to a third embodiment.

FIG. 4 is a plan view illustrating an exemplary arrangement of intermediate terminals and circuit blocks disposed in a controller of a semiconductor device according to a third embodiment.

In FIG. 4, this semiconductor device includes a controller. The controller may operate, for example, as an interface when data is input to and output from the NAND memory. The controller may be provided, for example, in the semiconductor chip 5 in FIG. 1A or in the semiconductor chip 15 in FIG. 3A.

The controller is assigned with two channels CH0 and CH1. The controller includes interface circuits 22A_0, 22B_0, 22A_1, and 22B_1, conversion circuits 23_0 and 23_1, and a control circuit 21. The interface circuits 22A_0 and 22B_0 and the conversion circuit 23_0 may correspond to the channel CH0. The interface circuits 22A_1 and 22B_1 and the conversion circuit 23_1 may correspond to the channel CH1.

Each of the interface circuits 22A_0 and 22A_1 is able to exchange signals with a device external to the controller. At this time, each of the interface circuits 22A_0 and 22A_1 is able to convert an externally set data format to a data format corresponding to the NAND memory at the time of data input, and convert the data format set in the NAND memory at the time of data output to the external output destination. Each of the interface circuits 22B_0 and 22B_1 is able to receive control signals from a device external to the controller.

Each of the conversion circuits 23_0 and 23_1 may include a data input latch circuit and a data output multiplex circuit. For example, the data input latch circuit is able to convert 8-bit data sent from the outside of the controller into 128-bit data and send it to the NAND memory. For example, the data output latch circuit is able to convert 128-bit data sent from the NAND memory into 8-bit data and send it to an external output destination. The control circuit 21 may activate the internal operation of the controller based on a control signal sent from a device external to the controller.

The interface circuit 22A_0 may be provided for each of input/output signals IO0_0 to IO7_0, read enable signals REn_0 and BREn_0, and data strobe signals DQS_0 and BDQS_0 of the channel CH0. The read enable signal BREn_0 is an inverted signal of the read enable signal REn_0. The data strobe signal BDQS_0 is an inverted signal of data strobe signal DQS_0.

The interface circuit 22B_0 may be provided for each of a chip enable signal CEn_0, an address latch enable signal ALE_0, a command latch enable signal CLE_0, and a write enable signal WEn_0 of the channel CH0.

Upon receiving the chip enable signal CEn_0, the control circuit 21 may activate the operation of the channel CH0 of its own controller. Upon receiving the address latch enable signal ALE_0, the control circuit 21 may regard the input/output signals IO0_0 to IO7_0 as addresses. Upon receiving the command latch enable signal CLE_0, the control circuit 21 may regard the input/output signals IO0_0 to IO7_0 as commands.

The interface circuit 22A_1 may be provided for each of input/output signals IO0_1 to IO7_1, read enable signals REn_1 and BREn_1, and data strobe signals DQS_1 and BDQS_1 of the channel CH1. The read enable signal BREn_1 is an inverted signal of the read enable signal REn_1. The data strobe signal BDQS_1 is an inverted signal of data strobe signal DQS_1.

The interface circuit 22B_1 may be provided for each of a chip enable signal CEn_1, an address latch enable signal ALE_1, a command latch enable signal CLE_1, and a write enable signal WEn_1 of the channel CH1.

Upon receiving the chip enable signal CEn_1, the control circuit 21 may activate the operation of the channel CH1 of its own controller. Upon receiving the address latch enable signal ALE_1, the control circuit 21 may regard the input/output signals IO0_1 to IO7_1 as addresses. Upon receiving the command latch enable signal CLE_1, the control circuit 21 may regard the input/output signals IO0_1 to IO7_1 as commands.

An input driver IR_0 is provided in the interface circuits 22A_0, 22B_0. The input driver IR_0 may be provided for each of the input/output signals IO0_0 to IO7_0, the chip enable signal CEn_0, the address latch enable signal ALE_0, the command latch enable signal CLE_0, and the write enable signal WEn_0 of the channel CH0. The read enable signals REn_0 and BREn_0 may share one input driver IR_0, and the data strobe signals DQS_0 and BDQS_0 may share one input driver IR_0.

An off chip driver (OCD) circuit IO_0 is provided in the interface circuit 22A_0 corresponding to the input/output signals IO0_0 to IO7_0. The OCD circuit IO_0 may be provided for each of the input/output signals IO0_0 to IO7_0.

An input driver IR_1 is provided in the interface circuits 22A_1, 22B_1. The input driver IR_1 may be provided for each of the input/output signals IO0_1 to IO7_1, the chip enable signal CEn_1, the address latch enable signal ALE_1, the command latch enable signal CLE_1, and the write enable signal WEn_1 of the channel CH1. The read enable signals REn_1 and BREn_1 may share one input driver IR_1, and the data strobe signals DQS_1 and BDQS_1 may share one input driver IR_1.

An OCD circuit IO_1 is provided in the interface circuit 22A_1 corresponding to the input/output signals IO0_1 to IO7_1. The OCD circuit IO_1 may be provided for each of the input/output signals IO0_1 to IO7_1.

The input drivers IR_0 and IR_1 are able to apply a driving force to a signal sent from the outside or shift the level of the signal sent from the outside. The OCD circuits IO_0 and IO_1 are able to apply a driving force to a signal sent to the outside or shift the level of the signal sent to the outside.

Input drivers IR_0 respectively corresponding to the input/output signals IO0_0 to IO7_0 are connected to the conversion circuit 23_0 via wirings DI_0.

The input driver IR_0 corresponding to the data strobe signals DQS_0 and BDQS_0 is connected to the conversion circuit 23_0 via wirings KI_0. The input driver IR_0 corresponding to the read enable signals REn_0 and BREn_0 is connected to the OCD circuit IO_0 and the interface circuit 22A_0 corresponding to the data strobe signals DQS_0 and BDQS_0 via the wirings KO_0. The OCD circuit IO_0 is connected to the conversion circuit 23_0 via wirings DO_0.

The input drivers IR_1 respectively corresponding to the input/output signals IO0_1 to IO7_1 are connected to the conversion circuit 23_1 via wirings DI_1. The input driver IR_1 corresponding to the data strobe signals DQS_1 and BDQS_1 is connected to the conversion circuit 23_1 via wirings KI_1. The input driver IR_1 corresponding to the read enable signals REn_1 and BREn_1 is connected to the OCD circuit IO_1 and the interface circuit 22A_1 corresponding to the data strobe signals DQS_1 and BQS_1 via wirings KO_1. The OCD circuit IO_1 is connected to the conversion circuit 23_1 via wirings DO_1.

The input drivers IR_0 respectively corresponding to the chip enable signal CEn_0, the address latch enable signal ALE_0, the command latch enable signal CLE_0, and the write enable signal WEn_0 are connected to the control circuit 21 via wirings CT_0.

The input driver IR_1 respectively corresponding to the chip enable signal CEn_1, the address latch enable signal ALE_1, the command latch enable signal CLE_1, and the write enable signal WEn_1 are connected to the control circuit 21 via wirings CT_1.

In addition, the controller includes intermediate terminals 24A_0, 24B_0, 24A_1, 24B_1, and 24'. A through via 26B is disposed on the intermediate terminals 24'.

The conversion circuit 23_0 is connected to the intermediate terminals 24' via wirings H_0. The conversion circuit 23_1 is connected to the intermediate terminals 24' via wirings H_1. The control circuit 21 is connected to the intermediate terminals 24' via wirings CT.

The intermediate terminals 24A_0 may be provided for each of the input/output signals IO0_0 to IO7_0, the read enable signals REn_0 and BREn_0, and the data strobe signals DQS_0 and BDQS_0 of the channel CH0.

The intermediate terminals 24A_1 may be provided for each of the input/output signals IO0_1 to IO7_1, the read enable signals REn_1 and BREn_1, and the data strobe signals DQS_1 and BDQS_1 of the channel CH1.

The intermediate terminals 24B_0 may be provided for each of the chip enable signal CEn_0, the address latch enable signal ALE_0, the command latch enable signal CLE_0, and the write enable signal WEn_0.

The intermediate terminals 24B_1 may be provided for each of the chip enable signal CEn_1, the address latch enable signal ALE_1, the command latch enable signal CLE_1, and the write enable signal WEn_1.

The intermediate terminals 24A_0 and 24A_1 may be disposed along the sides facing each other across the intermediate terminals 24'. The intermediate terminals 24B_0 and 24B_1 may be disposed along the sides facing each other across the intermediate terminals 24'.

In addition, the intermediate terminals 24A_0 of the input/output signals IO0_0 to IO7_0 may be arranged point-symmetrically with the intermediate terminals 24A_1 of the input/output signals IO0_1 to IO7_1 about a reference point OA2 of the controller, respectively. The reference point OA2 may be the center point of the controller. The intermediate terminals 24A_0 of the read enable signals REn_0 and BREn_0 may be arranged point-symmetrically with the intermediate terminals 24A_1 of the read enable signals REn_1 and BREn_1 about the reference point OA2 of the controller, respectively. The intermediate terminals 24A_0 of the data strobe signals DQS_0 and BDQS_0 may be arranged point-symmetrically with the intermediate terminals 24A_1 of the data strobe signals DQS_1 and BDQS_1 about the reference point OA2 of the controller, respectively.

The intermediate terminals 24B_0 of the chip enable signal CEn_0, the address latch enable signal ALE_0, the command latch enable signal CLE_0, and the write enable signal WEn_0 may be arranged line-symmetrically with the intermediate terminals 24B_1 of the chip enable signal CEn_1, the address latch enable signal ALE_1, the command latch enable signal CLE_1, and the write enable signal WEn_1 with respect to a reference line LA2 of the controller, respectively. The reference line LA2 may be the center line of the controller.

When the controller illustrated in FIG. 4 is provided, for example, in the semiconductor chip 5 illustrated in FIG. 1B, the intermediate terminals 24A_0 and 24A_1 may correspond to the intermediate terminals 4 in FIG. 1B, the intermediate terminals 24' may correspond to the intermediate terminals 4' in FIG. 1B, the through vias 26B may correspond to the through vias 6B in FIG. 1B, and the wirings DI_1, DI_1, DO_0, DO_1, KI_0, KI_1, KO_0, and KO_1 may correspond to the wirings 5A in FIG. 1B.

Here, for each of the input/output signals IO0_0 to IO7_0 and IO0_1 to IO7_1, the read enable signals REn_0, BREn_0, REn_1, and BREn_1, and the data strobe signals DQS_0, BDQS_0, DQS_1, and BDQS_1, the wiring length of these signals may be shortened by arranging the intermediate terminals 24A_0 and 24A_1 point-symmetrically about the reference point OA2 of the controller, respectively. As a result, it is possible to reduce the wiring resistance and the wiring capacitance of the wirings of these signals, so that it is possible to prevent the timing gap of these signals from occurring between the channels CH0 and CH1, and reduce power consumption.

Further, for each of chip enable signals CEn_0 and CEn_1, the address latch enable signals ALE_0 and ALE_1, the command latch enable signals CLE_0 and CLE_1, and the write enable signals WEn_0 and WEn_1, the wiring length of these control signals may be shortened by arranging the intermediate terminals 24B_0 and 24B_1 line-symmetrically with respect to the reference line LA2 of the controller. As a result, it is possible to reduce the wiring resistance and the wiring capacitance of the wirings of these control signals, so that it is possible to prevent the timing gap of these control signals from occurring between the channels CH0 and CH1, and reduce power consumption.

Figure 5A:
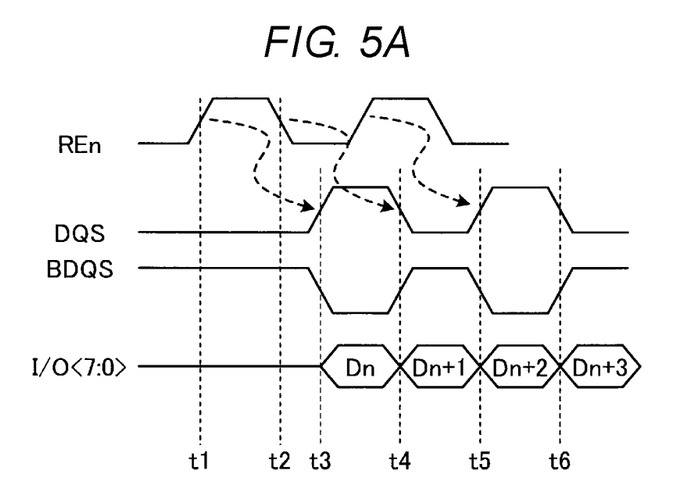
FIG. 5A is a timing chart illustrating signal waveforms at the time of data output of the controller of FIG. 4.
Figure 5B:
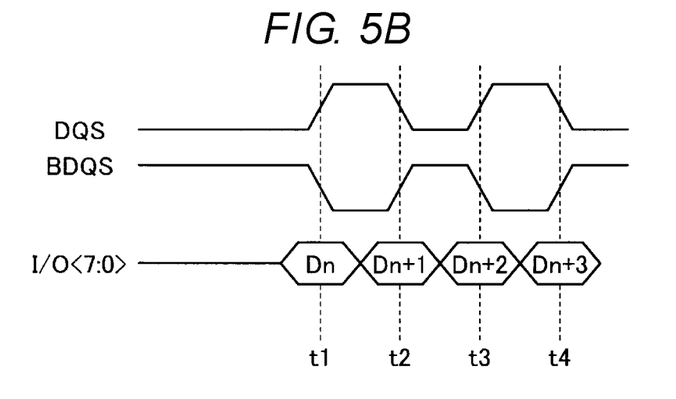
FIG. 5B is a timing chart illustrating signal waveforms at the time of data input of the controller of FIG. 4.

FIG. 5A is a timing chart illustrating signal waveforms at the time of data output by the controller of FIG. 4. FIG. 5B is a timing chart illustrating signal waveforms at the time of data input by the controller of FIG. 4. The read enable signal REn may be made to correspond to the read enable signals REn_0 and REn_1 in FIG. 4. The data strobe signals DQS and BDQS may correspond to the data strobe signals DQS_0, BDQS_0, DQS_1, and BDQS_1 in FIG. 4. The input/output signals I/O <7:0> may correspond to the input/output signals IO0_0 to IO7_0 and IO0_1 to IO7_1 of FIG. 4. Further, FIGS. 5A and 5B illustrate a case where data Dn to Dn+3 are input/output at DDR (double-data-rate) by way of an example.

In FIG. 5A, the read enable signal REn is sent to the controller at the time of data output. Then, the data strobe signals DQS and BDQS are generated based on the read enable signal REn.

For example, when the read enable signal REn rises at time t1, the data strobe signal DQS rises at time t3, and the data strobe signal BDQS falls at time t3. When the read enable signal REn falls at time t2, the data strobe signal DQS falls at time t4, and the data strobe signal BDQS rises at time t4.

The data Dn to Dn+3 read from the NAND memory are output from the controller to the outside at a timing of both edges of the data strobe signal DQS.

For example, when the data strobe signal DQS rises at time t3, the data Dn is output from the controller to the outside at the same timing. When the data strobe signal DQS falls at time t4, the data Dn+1 is output from the controller to the outside at the same timing. When the data strobe signal DQS rises at time t5, the data Dn+2 is output from the controller to the outside at the same timing. When the data strobe signal DQS falls at time t6, the data Dn+3 is output from the controller to the outside at the same timing.

Meanwhile, in FIG. 5B, at the time of the data input, the data Dn to Dn+3 are input from the controller to the NAND memory at the timing of both edges of the data strobe signal DQS.

For example, when the data strobe signal DQS rises at time t1, the data Dn is input from the controller to the NAND memory. When the data strobe signal DQS falls at time t2, the data Dn+1 is input from the controller to the NAND memory. When the data strobe signal DQS rises at time t3, the data Dn+2 is input from the controller to the NAND memory. When the data strobe signal DQS falls at time t4, the data Dn+3 is input from the controller to the NAND memory.

Fourth Embodiment

Figure 6:
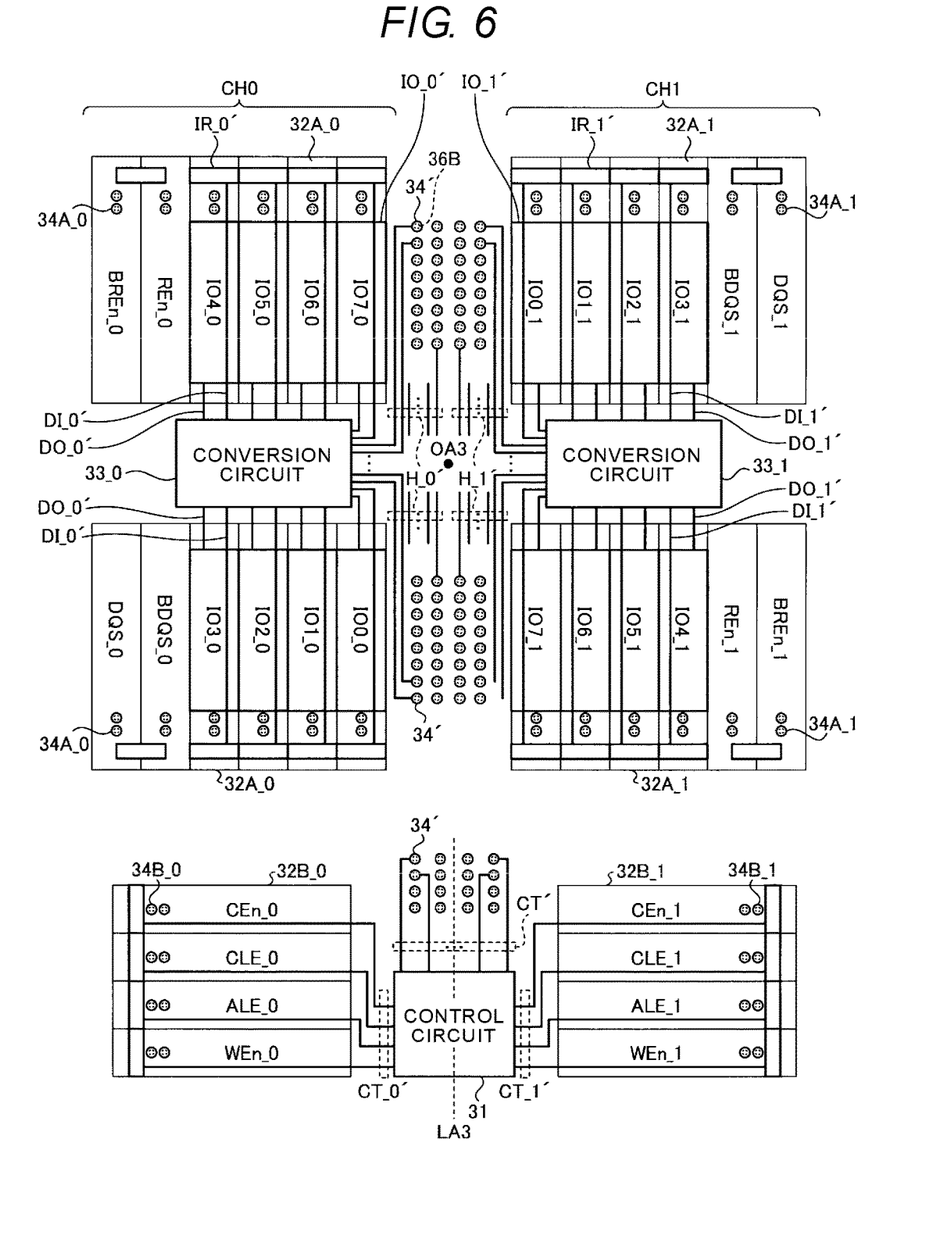
FIG. 6 is a plan view of intermediate terminals and circuit blocks disposed in a controller of a semiconductor device according to a fourth embodiment.

FIG. 6 is a plan view of intermediate terminals and circuit blocks disposed in a controller of a semiconductor device according to a fourth embodiment.

In FIG. 6, two channels CH0 and CH1 are assigned to the controller. The controller includes interface circuits 32A_0, 32B_0, 32A_1, and 32B_1, conversion circuits 33_0 and 33_1, and a control circuit 31. The interface circuits 32A_0 and 32B_0 and the conversion circuit 33_0 may correspond to the channel CH0. The interface circuits 32A_1 and 32B_1 and the conversion circuit 33_1 may correspond to the channel CH1.

The interface circuit 32A_0 may be provided for each of input/output signals IO0_0 to IO7_0, read enable signals REn_0 and BREn_0, and data strobe signals DQS_0 and BDQS_0 of the channel CH0.

The interface circuit 32B_0 may be provided for each of a chip enable signal CEn_0, an address latch enable signal ALE_0, a command latch enable signal CLE_0, and a write enable signal WEn_0 of the channel CH0.

The interface circuit 32A_1 may be provided for each of input/output signals IO0_1 to IO7_1, read enable signals REn_1 and BREn_1, and data strobe signals DQS_1 and BDQS_1 of the channel CH1. The read enable signal BREn_1 is an inverted signal of the read enable signal REn_1. The data strobe signal BDQS_1 is an inverted signal of data strobe signal DQS_1.

The interface circuit 32B_1 may be provided for each of a chip enable signal CEn_1, an address latch enable signal ALE_1, a command latch enable signal CLE_1, and a write enable signal WEn_1 of the channel CH1.

An input driver IR_0' is provided in the interface circuits 32A_0 and 32B_0. The input driver IR_0' may be provided for each of the input/output signals IO0_0 to IO7_0, the chip enable signal CEn_0, the address latch enable signal ALE_0, the command latch enable signal CLE_0, and the write enable signal WEn_0 of the channel CH0. The read enable signals REn_0 and BREn_0 may share one input driver IR_0', and the data strobe signals DQS_0 and BDQS_0 may share one input driver IR_0.

An OCD circuits IO_0' is provided in the interface circuit 32A_0 corresponding to the input/output signals IO0_0 to IO7_0. The OCD circuit IO_0' may be provided for each of the input/output signals IO0_0 to IO7_0.

An input driver IR_1' is provided in the interface circuits 32A_1 and 32B_1. The input driver IR_1 may be provided for each of the input/output signals IO0_1 to IO7_1, the chip enable signal CEn_1, the address latch enable signal ALE_1, the command latch enable signal CLE_1, and the write enable signal WEn_1 of the channel CH1. The read enable signals REn_1 and BREn_1 may share one input driver IR_1', and the data strobe signals DQS_1 and BDQS_1 may share one input driver IR_1'.

An OCD circuits IO_1' are provided in the interface circuit 32A_1 corresponding to the input/output signals IO0_1 to IO7_1. The OCD circuit IO_1 may be provided for each of the input/output signals IO0_1 to IO7_1.

The input drivers IR_0' respectively corresponding to the input/output signals IO0_0 to IO7_0 are connected to the conversion circuit 33_0 via wirings DI_1'. The OCD circuit IO_0' is connected to the conversion circuit 33_0 via wirings DO_0'.

The input drivers IR_1' respectively corresponding to the input/output signals IO0_1 to IO7_1 are connected to the conversion circuit 33_1 via wirings DI_1'. The OCD circuit IO_1' is connected to the conversion circuit 33_1 via wirings DO_1'.

The input drivers IR_0' respectively corresponding to the chip enable signal CEn_0, the address latch enable signal ALE_0, the command latch enable signal CLE_0, and the write enable signal WEn_0 are connected to the control circuit 31 via wirings CT_0'.

The input drivers IR_1' respectively corresponding to the chip enable signal CEn_1, the address latch enable signal ALE_1, the command latch enable signal CLE_1, and the write enable signal WEn_1 are connected to the control circuit 31 via wirings CT_1'.

In addition, the controller includes intermediate terminals 34A_0, 34B_0, 34A_1, 34B_1, and 34'. A through via 36B is disposed on the intermediate terminals 34'.

The conversion circuit 33_0 is connected to the intermediate terminals 34' via wirings H_0'. The conversion circuit 33_1 is connected to the intermediate terminals 34' via wirings H_1'. The control circuit 31 is connected to the intermediate terminals 34' via wirings CT'.

The intermediate terminals 34A_0 may be provided for each of the input/output signals IO0_0 to IO7_0, the read enable signals REn_0 and BREn_0, and the data strobe signals DQS_0 and BDQS_0 of the channel CH0.

The intermediate terminals 34A_1 may be provided for each of the input/output signals IO0_1 to IO7_1, the read enable signals REn_1 and BREn_1, and the data strobe signals DQS_1 and BDQS_1 of the channel CH1.

The intermediate terminals 34B_0 may be provided for each of the chip enable signal CEn_0, the address latch enable signal ALE_0, the command latch enable signal CLE_0, and the write enable signal WEn_0.

The intermediate terminals 34B_1 may be provided for each of the chip enable signal CEn_1, the address latch enable signal ALE_1, the command latch enable signal CLE_1, and the write enable signal WEn_1.

The intermediate terminals 34A_0 of the input/output signals IO4_0 to IO7_0 and the read enable signals REn_0 and BREn_0 and the intermediate terminals 34A_0 of the input/output signals IO0_0 to IO3_0, and the data strobe signals DQS_0 and BDQS_0 may be disposed along sides that face each other across the conversion circuit 33_0.

In this case, the conversion circuit 33_0 may be disposed between the input driver IR_0' and the OCD circuit IO_0' of the input/output signals IO4_0 to IO7_0 and the input driver IR_0' and OCD circuit IO_0' of the input/output signals IO0_0 to IO3_0. Therefore, the wirings DI_1' between the input driver IR_0' and the conversion circuit 33_0 may be shortened. In addition, the wirings DO_0' between the OCD circuit IO_0' and the conversion circuit 33_0 may be shortened.

The intermediate terminals 34A_1 of the input/output signals IO4_1 to IO7_1 and the read enable signals REn_1 and BREn_1 and the intermediate terminals 34A_1 of the input/output signals IO0_1 to IO3_1 and the data strobe signals DQS_1 and BDQS_1 may be disposed along sides that face each other across the conversion circuit 33_1.

In this case, the conversion circuit 33_1 may be disposed between the input driver IR_1' and the OCD circuit IO_1' of the input/output signals IO4_1 to IO7_1 and the input driver IR_1' and OCD circuit IO_1' of the input/output signals IO0_1 to IO3_1. Therefore, the wirings DI_1' between the input driver IR_1' and the conversion circuit 33_1 may be shortened. In addition, the wirings DO_1' between the OCD circuit IO_1' and the conversion circuit 33_1 may be shortened.

The intermediate terminals 34B_0 and 34B_1 may be disposed along the sides facing each other across the intermediate terminals 34'.

In addition, the intermediate terminals 34A_0 of the input/output signals IO0_0 to IO7_0 may be arranged point-symmetrically with the intermediate terminals 34A_1 of the input/output signals IO0_1 to IO7_1 about a reference point OA3 of the controller, respectively. The reference point OA3 may be the center point of the controller. The intermediate terminals 34A_0 of the read enable signals REn_0 and BREn_0 may be arranged point-symmetrically with the intermediate terminals 34A_1 of the read enable signals REn_1 and BREn_1 about the reference point OA3 of the controller, respectively. The intermediate terminals 34A_0 of the data strobe signals DQS_0 and BDQS_0 may be arranged point-symmetrically with the intermediate terminals 34A_1 of the data strobe signals DQS_1 and BDQS_1 about the reference point OA3 of the controller, respectively.

The intermediate terminals 34B_0 of the chip enable signal CEn_0, the address latch enable signal ALE_0, the command latch enable signal CLE_0, and the write enable signal WEn_0 may be arranged line-symmetrically with the intermediate terminals 34B_1 of the chip enable signal CEn_1, the address latch enable signal ALE_1, the command latch enable signal CLE_1, and the write enable signal WEn_1 with respect to a reference line LA3 of the controller, respectively. The reference line LA3 of the controller may be the center line of the controller.

When the controller of FIG. 6 is provided, for example, in the semiconductor chip 5 of FIG. 1B, the intermediate terminals 34A_0 and 34A_1 correspond to the intermediate terminals 4 of FIG. 1B. In addition, the intermediate terminals 34' correspond to the intermediate terminals 4' of FIG. 1B. Further, the through vias 36B corresponds to the through vias 6B in FIG. 1B, and the wirings DI_1', DI_1', DO_0', DO_1' correspond to the wirings 5A in FIG. 1B.

Here, for each of the input/output signals IO0_0 to IO7_0 and IO0_1 to IO7_1, the read enable signals REn_0, BREn_0, REn_1, and BREn_1, and the data strobe signals DQS_0, BDQS_0, DQS_1, and BDQS_1, the wiring length of these signals may be shortened by arranging the intermediate terminals 34A_0 and 34A_1 point-symmetrically about the reference point OA3 of the controller, respectively. Therefore, it is possible to reduce the wiring resistance and the wiring capacitance of the wirings of these signals. As a result, it is possible to prevent the timing gap of these signals from occurring between the channels CH0 and CH1, and reduce power consumption.

Further, for each of chip enable signals CEn_0 and CEn_1, the address latch enable signals ALE_0 and ALE_1, the command latch enable signals CLE_0 and CLE_1, and the write enable signals WEn_0 and WEn_1, the wiring length of these control signals may be shortened by arranging the intermediate terminals 34B_0 and 34B_1 line-symmetrically with respect to the reference line LA3 of the controller. Therefore, it is possible to reduce the wiring resistance and the wiring capacitance of the wirings of these control signals. As a result, it is possible to prevent the timing gap of these control signals between the channels CH0 and CH1, and reduce power consumption.

Fifth Embodiment

Figure 7:
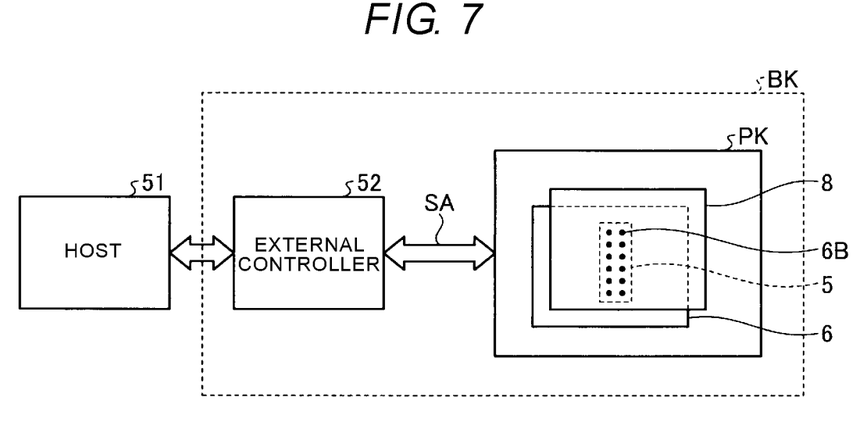
FIG. 7 is a block diagram of a semiconductor device according to a fifth embodiment.

FIG. 7 is a block diagram of a semiconductor device according to a fifth embodiment.

In FIG. 7, the package PK of FIG. 1A and an external controller 52 are mounted on a motherboard BK. The external controller 52 is connected to the host 51 via a host interface. The package PK may be mounted on the motherboard BK via the external terminals 1. The motherboard BK may be mounted on, for example, a memory card such as an SD card, a multimedia card such as eMMC™, an external storage device such as a solid-state drive (SSD), or a memory module conforming to a universal flash storage (UFS) standard.

The external controller 52 may perform a processing specific to the NAND memory and the like. For example, the external controller 52 may perform buffering of read data or write data, an error correction code (ECC) processing, a wear-leveling processing, a randomizing processing, and the like. The wear-leveling process is a process for suppressing the writing of data from concentrating on a specific block of the NAND memory. The randomizing process is a process for preventing data to be written in the same block of the NAND memory from having periodicity, so that inter-cell interference hardly occurs.

According to the above configuration, the signal SA may be exchanged between the external controller 52 and the semiconductor chip 5. For example, it is possible to exchange a chip enable signal CEn, an address latch enable signal ALE, a command latch enable signal CLE, a write enable signal WEn, a read enable signal REn, a data strobe signal DQS, data DA, address AD, command CM, and the like between the external controller 52 and the semiconductor chip 5.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first chip having a through via;
a second chip having a first terminal that is electrically connected to the through via; and
a substrate having a second terminal disposed on a first surface thereof and electrically connected to the first terminal, wherein
when viewed along a straight line that intersects a center axis that is perpendicular to the first surface and intersects a center point of the substrate, the first terminal is disposed further towards the center axis than the second terminal and the through via is disposed further towards the center axis than the first terminal.

2. The semiconductor device according to claim 1, wherein each of the first and second terminals is a terminal for receiving at least one of data and clock signals.

3. The semiconductor device according to claim 2, further comprising:
a third terminal disposed on a second surface of the substrate opposite to the first surface, wherein
the second terminal is disposed between the first chip and the substrate, and
when viewed along the straight line, the second terminal is disposed further towards the center axis than the third terminal.

4. The semiconductor device according to claim 3, wherein the third terminal is a terminal for receiving at least one of data and clock signals.

5. The semiconductor device according to claim 4, wherein the first terminal is one of a plurality of first input/output terminals that are arranged point-symmetrically, the second terminal is one of a plurality of second input/output terminals that are arranged point-symmetrically, and the third terminal is one of a plurality of third input/output terminals that are arranged point-symmetrically.

6. The semiconductor device according to claim 1, wherein the first chip is a memory chip, and the second chip is an interface chip.

7. The semiconductor device according to claim 6, wherein
the first terminal and the second terminal are bump electrodes, and
the first chip and the second chip are resin-sealed on the substrate.

8. The semiconductor device according to claim 1, wherein the first terminal is one of a plurality of first input/output terminals for a first channel, which are arranged point-symmetrically with each other, and first control terminals for the first channel, which are arranged line-symmetrically with each other, and the second terminal is one of a plurality of second input/output terminals for a second channel, which are arranged point-symmetrically with each other, and second control terminals for the second channel which are arranged line-symmetrically with each other.

9. The semiconductor device according to claim 8, wherein each of the first input/output terminals and second input/output terminals is a terminal for receiving at least one of data and clock signals.

10. The semiconductor device according to claim 8, wherein the first chip is a memory chip, and the second chip is an interface chip.

11. The semiconductor device according to claim 10, wherein the first terminal and the second terminal are bump electrodes, and the first chip and the second chip are resin-sealed on the substrate.

* * * * *